(12) United States Patent
Ernest et al.

(10) Patent No.: US 7,898,239 B2
(45) Date of Patent: Mar. 1, 2011

(54) HIGH-VOLTAGE GENERATOR OF AN X-RAY APPARATUS COMPRISING A HIGH-VOLTAGE MEASUREMENT DEVICE

(75) Inventors: Philippe Ernest, Gif sur Yvette (FR); Laurence Abonneau-Casteignau, La-Celle-les-Bordes (FR); Florent Liffran, Paris (FR)

(73) Assignee: General Electric Company, Schenectady, NY (US)

( * ) Notice: Subject to any disclaimer, the term of this patent is extended or adjusted under 35 U.S.C. 154(b) by 523 days.

(21) Appl. No.: 11/943,431

(22) Filed: Nov. 20, 2007

(65) Prior Publication Data
US 2008/0122425 A1 May 29, 2008

(30) Foreign Application Priority Data
Nov. 28, 2006 (FR) ...................................... 06 55168

(51) Int. Cl.
*G01R 27/26* (2006.01)
*H05G 1/64* (2006.01)
(52) U.S. Cl. ........................... 324/72; 324/658; 378/98.8
(58) Field of Classification Search ................... 324/72, 324/658; 378/98.8, 98.9, 119; 361/271–330, 361/600–837
See application file for complete search history.

(56) References Cited

FOREIGN PATENT DOCUMENTS
DE    44 36 305 A1    4/1996
DE     4436305 A1 *  4/1996

\* cited by examiner

*Primary Examiner* — Melissa J Koval
*Assistant Examiner* — Farhana Hoque
(74) *Attorney, Agent, or Firm* — Global Patent Operation; Jonathan E. Thomas

(57) ABSTRACT

A high-voltage (HV) generator of an X-ray device comprises a high-voltage measurement device. The measurement device comprises a compact component integrating both the measurement resistor and the capacitors enabling both the protection of said resistor and the elimination of the parasitic effects of the generator. The capacitors are made on insulating plates preferably made of ceramic, a succession of metallized strips and insulating strips. The plates are positioned relative to one another in such a way that the capacitors are discrete and series-mounted. To do this, between two successive plates, the metallized strips of the bottom plate overlap two metallized strips of the plate directly above.

16 Claims, 2 Drawing Sheets

HIGH-VOLTAGE GENERATOR OF AN X-RAY APPARATUS COMPRISING A HIGH-VOLTAGE MEASUREMENT DEVICE

RELATED APPLICATIONS

This application claims priority under 35 USC 119 to co-pending French patent application serial number 0655168, filed on 28 Nov. 2006, which is herein incorporated by reference in its entirety.

BACKGROUND

The field of the invention is that of the generation of high voltages and apparatuses using these high voltages. In particular, the field of the invention is that of medical apparatuses for X-ray image acquisition. However, the invention is applicable in any other field in which a measurement of high voltage is made.

DESCRIPTION OF PRIOR ART

X-ray apparatuses today are used to obtain images or even sequences of images of an organ situated within a living being, especially a human being. The X-ray apparatus comprises an X-ray tube generally contained in a metal jacket. The X-ray apparatus comprises a high-voltage generator supplying the X-ray tube with energy. This high-voltage generator is contained in an enclosure generally situated at some distance from the X-ray tube. In operating mode, one or more high-insulation cables convey the high voltage up to the jacket containing the X-ray tube.

In the prior art, the generation of X-rays for medical image acquisition requires a supply voltage ranging from 40 kilovolts to 160 kilovolts across the anode and cathode of the X-ray tube. This high voltage is obtained with a bipolar or monopolar generator.

In the case of a bipolar generator, two voltages symmetrical relative to ground are applied to the tube. The high voltage given by the generator is regulated here in controlling the sum of the two high voltages namely the positive and negative voltages, applied respectively to the anode and to the cathode. In this case, the two high voltages are measured by two identical measurement devices.

For a monopolar generator, the high voltage is regulated by controlling the voltage applied to the cathode. In this case, the high voltage is measured by a single measurement device. These high-voltage measurement devices are used to divide the voltage measured in a ratio of the order of 10 000, i.e. generally one volt for 10 kilovolts.

One example of a prior-art high-voltage measurement device is shown in FIG. 1. In the example of FIG. 1, the measurement device 1 is immersed in an insulating fluid, generally oil. The device 1 has a high-value resistor R1, with resistance of the order of some hundreds of megaohms (MΩ). One end E1 of this resistor R1, commonly called a high-voltage measurement bleeder resistor, is connected to an impulse generator giving the high voltage to be measured. Another end E2 of this resistor R1 is connected to a resistor R2 with a value of some tens of kiloohms (kΩ), commonly called a bleeder foot resistor. The bleeder foot resistor can be placed outside the measurement device 1.

Through this bleeder, thus connected to a bleeder foot resistor, a voltage divider bridge is made. The voltage at the terminals of the bleeder foot resistor is generally a $1/10000^{th}$ portion of the high voltage to be measured.

However, this type of measuring device has drawbacks. Indeed the build-up time of the pulse given by the generator is very short. It generally lasts 1 millisecond or even 0.5 milliseconds depending on the type of generator. The pulse response given by the measuring device during this build-up time comprises imperfections. In FIG. 2, a graph illustrates an example of a pulse response of the prior-art measuring device.

In the graph of FIG. 2, the curve 3 of the pulse response of the measuring device is represented in terms of Cartesian co-ordinates. The x-axis represents the time in milliseconds and the y-axis represents the voltage in volts. At the instant t0, the generator delivers a voltage for example of 100 kilovolts. The measuring device of FIG. 1 gives a response comprising sub-oscillations that last 1.5 milliseconds up to the instant t1. These sub-oscillations are due to the charging time of the cables of the generator.

The pulse response given with this type of device has imperfections. These imperfections are due to parasitic capacitances present firstly in the generator and secondly in the high-voltage cables of the generator. These parasitic capacitances with the measurement resistor behave like a resistor-capacitor circuit in pulse mode. These parasitic capacitances have a value that is not controlled and is non-linear.

To resolve this problem, there are prior-art approaches for coping with these sub-oscillations of the transient responses of the device.

In a first classic approach, a capacitive divider is added to the measurement device. This capacitive divider comprises capacitors with controlled capacitive values. With this approach, the theoretical pulse response of the device gets balanced with the capacitors at t=0 and with the resistors of the device at t=∞ prompting a perfect pulse response from the device. In practice, the residual parasitic capacitances generate sub-oscillations. The greater the increase in the capacitance of the capacitor, the greater is the increase in the residual defects of the transient response.

In another approach, the size of the system is increased to reduce the influence of the parasitic capacitances. The amount of space taken up by the measurement device is then incompatible with the compactness required for an X-ray apparatus especially in the case of a mobile apparatus.

At present, all the measurement devices enabling perfect high-voltage measurement during a transient phase lasting one millisecond are either prohibitively large or complex or even difficult to implement.

SUMMARY OF THE INVENTION

Embodiments of the invention overcome many or all of the drawbacks of the techniques referenced above. To this end, embodiments of the invention may provide a high-voltage measurement device for which the geometrical layout of the components results in eliminating the effects of the parasitic capacitors distributed all along the bleeder with the high voltage and with the ground potential. Thus, the measurement given by this measurement device is not dynamically falsified by the parasitic capacitances as it is in the prior art.

In an embodiment of the invention, the measurement device comprises capacitors laid out in such a way that, around the measurement resistor, also called a bleeder, they generate an electrical field for which the development of the potential is similar to that generated in steady operation mode by the resistor alone.

The bleeder is formed either by series-connected resistors or by a resistor screen-printed on a plate.

In the invention, the capacitors are made on insulating plates, preferably made of ceramic, by a succession of metallized strips or insulating strips. The films are positioned relative to one another in such a way that the capacitors are discrete and series-connected.

To this end, between two successive plates, the width of the metallized bottom strips crosses two metallized strips of the top film. This arrangement of the films and the electrical connection between the capacitors is such that the potential increases in stages all along the row of capacitors similarly to the internal potential of the bleeder.

Embodiments of the invention may be aimed at the integration, on a same component, of a capacitive divider formed by the capacitors made on ceramic plates and a measurement resistor made on one of the ceramic plates of said component. The result obtained is a measurement resistor that is protected and entirely integrated.

The layout and the connection of the measurement resistor and of the capacitors are such that the voltage across the component is linear. The electrostatic and electrical potential are identical at each point of the component, thus ensuring a good transient response. The invention enables the component to be protected against electrostatic disturbances if any. To this end, the distance between the films of the capacitor and the ceramic of the resistors is very small. This provides for a gain in space in the measurement device.

While providing tight protection to the measurement resistor, the device also provides an almost perfect pulse response, exactness in the response given and speed of measurement. Similarly, the measurement resistor may have higher values in order to reduce losses if any, without thereby disturbing the measurement made. The measurement device of the invention may be placed anywhere in the high-voltage generator.

The ceramic technology preferably used in the invention gives very small components as compared with other prior art approaches. Similarly, the manufacture of the measurement device of the invention is completely stable and the integration is easy.

Embodiments of the invention may thus enable close protection of the measurement resistor while at the same time integrating the protection capacitors in the same component. This enables perfect repeatability in the manufacture of a highly compact product. This compact product that is obtained offers many possibilities of position in the high-voltage generator.

An embodiment of a measurement device of the invention may consist of commonly used, low-cost components making its manufacture simple and inexpensive.

Exemplary main advantages of the invention include, but are not limited to:
  efficient transient response,
  immunity against noise, enabling any the measurement device to be placed anywhere in the high-voltage generator, and
  repeatability through the production lines.

More specifically, an embodiment of the invention may provide a high-voltage generator of an X-ray device that comprises a high-voltage measurement device. The high-voltage measurement device may be connected to the terminals of the high-voltage generator. The high voltage measurement device may comprise at least one measurement resistor and several capacitors. The measurement device may comprise a compact component that integrates both the measurement resistor and the capacitors. The compact component may comprise at least two insulating plates facing each other. The measurement resistor may be made on one face of a plate. The capacitors may be made on faces of plates situated beneath the face of the plate comprising the measurement resistor. The making of the capacitors may be implemented by a succession of metallized strips and insulating strips. The metallized strips of one face of a bottom plate may overlap two metallized strips of one face of a plate that is directly above.

An embodiment of the invention may also comprise one or more of the following characteristics:
  insulating plates made of ceramic;
  capacitors distributed discretely and series-mounted;
  width of the metallized strips is greater than or equal to the width of the insulating strips;
  measurement resistor made on the upper face of the insulating plate by screen-printing with a resistive ink;
  measurement resistor made out of resistive and discrete components;
  resistive component of the measurement resistor is screen-printed ink;
  resistive component of the measurement resistor obtained by laser etching the upper face of the insulating plate;
  metallized strips made of a screen-printed metal;
  metallized strips made by bonding to the insulating plate of a metal film;
  metallized strips made of copper or aluminium;
  minimum width of the metallization strips determined as a function of a preliminarily defined electrical insulation parameter;
  number of plates on which the capacitors are made depends on the capacitance of the capacitors;
  capacitors parallel-connected to the measurement resistor, the measurement device comprising a balancing capacitor (C) connected to a measurement point of the measurement device and to a ground (M);
  balancing capacitor (C) has a capacitance far below the capacitance of the capacitors of the plates, in a ratio that is inversely proportional to that of the resistors; and
  capacitors connected to the generator at a connection point different from that of the measurement resistor, and to ground.

BRIEF DESCRIPTION OF THE DRAWINGS

Embodiments of the invention will be understood more clearly from the following description and from the accompanying figures. These figures are given by way of an indication and in no way restrict the scope of the invention.

DETAILED DESCRIPTION OF EMBODIMENTS OF THE INVENTION

Figure 1:
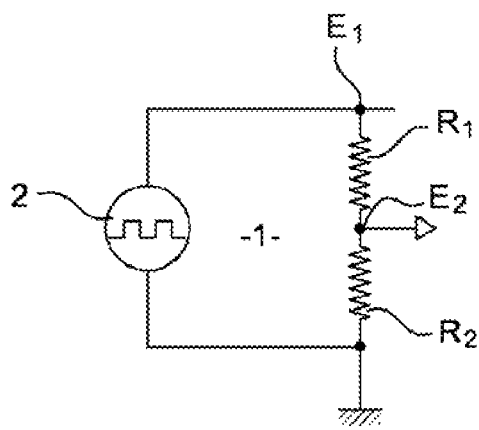
FIG. 1, already described, is a schematic representation of a prior-art high-voltage measurement device.
Figure 2:
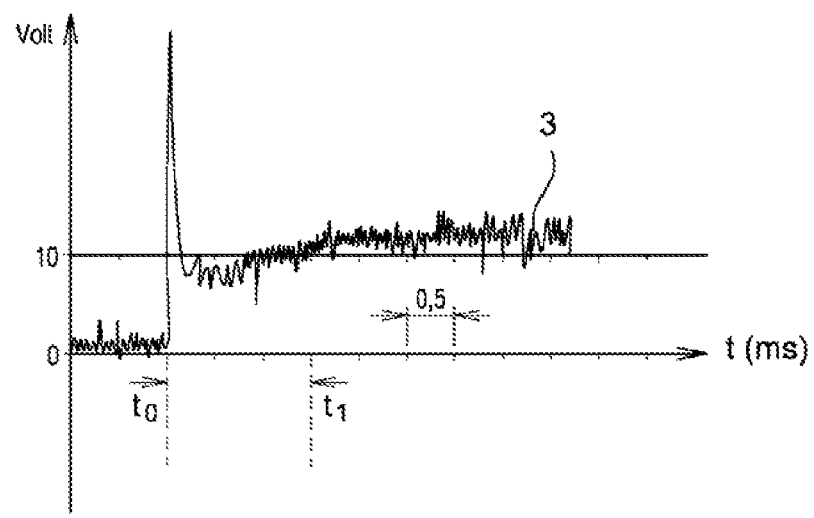
FIG. 2, already described, is a graph showing a pulse response given by the prior-art measurement device.
Figure 3:
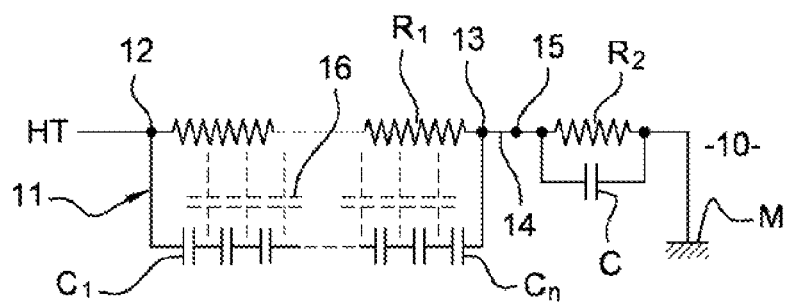
FIG. 3 is a schematic view of a high-voltage measurement device provided with the improved means of the invention.

FIG. 3 shows a high-voltage measurement device 10 provided with improved means of the invention. FIG. 3 shows a first mode of connection of capacitors series-mounted in the measurement device 10 and producing an electrical field suited to the implantation of the measurement resistor. The implementation of the discrete, series-mounted capacitors is described with reference to FIG. 7.

The measurement device 10 is placed in a high-voltage generator (not shown) of an X-ray tube in order to regulate the high voltage delivered by said generator. The measurement device 10 gives a pulse response proportional to the voltage delivered by the generator. This device 10 thus gives a voltage proportional to the high voltage delivered by the generator. In a preferred embodiment, the measurement device 10 divides the measured high voltage in a ratio of 10 000, i.e. generally one volt for ten kilovolts of the high voltage delivered by the generator. The measurement device 10 is immersed in an insulating fluid which is generally oil.

The measurement device 10 is generally a parallelepiped-shaped box made out of an insulating material. The measurement device 10 comprises a compact component 11 comprising a flat measurement resistor R1 with a high value of the order of some hundreds of megaohms. In one example, the resistance value of the measurement resistor R1 is equal to 100 megaohms. The resistance value of the measurement resistor R1 may also be equal, in another example, to 500 megaohms. The measurement resistor R1 has a first end 12 connected to the high-voltage generator. This measurement resistor R1 is commonly called a high-voltage measurement bleeder. The measurement resistor R1 has a second end 13 series-connected to a resistor R2 with a value of some tens of kiloohms connected to ground M. In one example, the resistance value of the resistor R2 is equal to 10 kiloohms. The resistor R2 is commonly called a bleeder foot resistor.

The connection between the measurement resistor R1 and the bleeder foot resistor R2 can be made with a sheathed wire 14. In one example, the bleeder foot resistor R2 may be situated outside the insulating fluid of the generator. In the example of FIG. 3, the measurement resistor R1 has a resistance value 10 000 times greater than that of the bleeder foot resistor R2. This means that the voltage measured at the measuring point 15 situated between the two resistors R1 and R2 is 10000 times lower than the voltage delivered by the generator.

However, owing to the parasitic capacitances internal to the generator and the capacitances of the sheathed cables of the generator, parasitic effects disturb the transient response of the measurement device 10. In order to eliminate these parasitic effects, the measuring device 10 has discrete, series-mounted capacitors C1 to Cn. These capacitors C1 to Cn are capable of compensating for the parasitic effects.

The capacitance of the series-mounted capacitors C1 to Cn is greater than the parasitic capacitances. The higher this value, the greater the control over the potentials created and the lower the influence of this value on the measurement resistor R1. However, a compromise must be made in determining the capacitance of the capacitors C1 to Cn and C'1 to C'n. For, the greater the capacitance of the capacitors C1 to Cn, the greater the possibility that the measurement might include residual defects. In one example, the capacitance of the capacitors C1 to Cn ranges from 1 to 100 picofarads.

Figure 4:
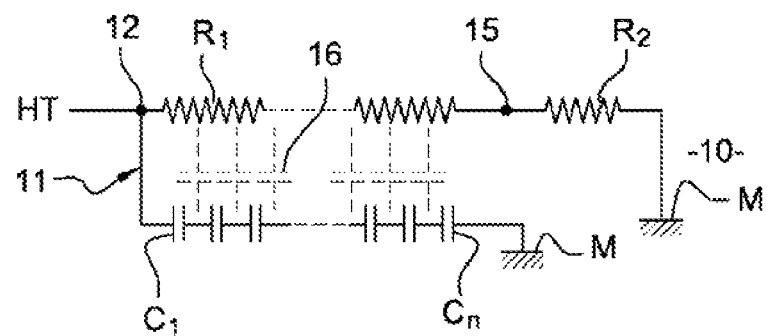
FIG. 4 shows another embodiment of the measurement device of the invention.

FIGS. 3 and 4 shows two modes of connection of the rows 15 and 16 of the capacitors C1 to Cn to the high-voltage generator and to ground M. In the example of FIG. 3, the series-mounted capacitors C1 to Cn are parallel-connected to the measurement resistor R1. With this type of connection, the pulse response of the device gets balanced with the capacitors at t=0 and with the measurement resistor R1 of the device at t=∞ prompting a resistance-capacitance pulse response from the device. To eliminate the residual defects of the transient response, the capacitance of the capacitors C1 to Cn is balanced with a balancing capacitor C parallel-connected with the bleeder foot resistor R2. In the example of FIG. 3, this type of connection enables compensation for the parasitic capacitances that will exist through the measurement resistor R1. The balancing capacitor (C) has a capacitance greatly below the capacitance of the capacitors of the plates, in a ratio inversely proportional to that of the resistors.

In the example of FIG. 4, the series-mounted capacitors C1 to Cn are connected to the high-voltage generator and to ground M. In a preferred example, the capacitors C1 to Cn are connected to the generator at a point different from that of the measurement resistor R1. With this type of assembly, it is not necessary to balance the capacitance of the capacitors C1 to Cn as in the example of FIG. 3. With this type of connection of the capacitors C1 to Cn, very high tolerance is obtained for the capacitance of said capacitors C1 to Cn.

Figure 5:
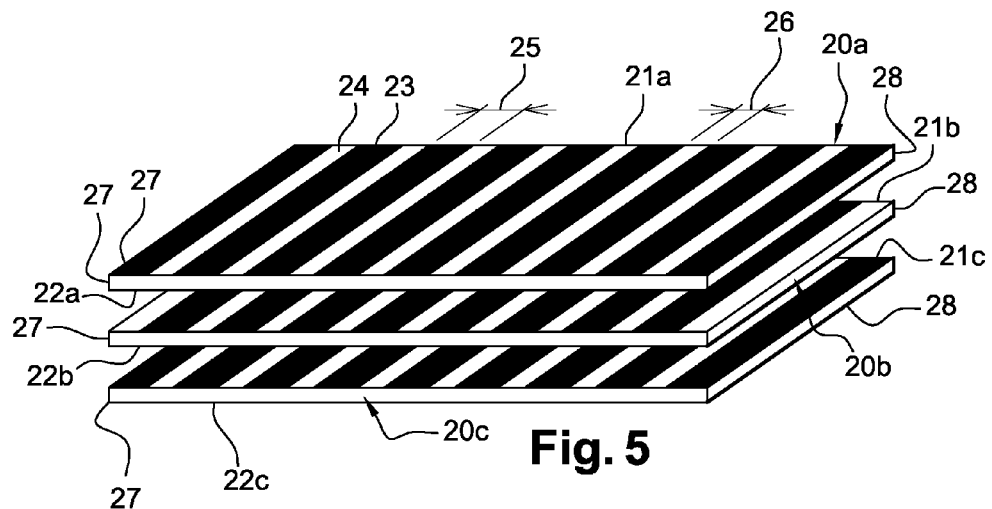
FIG. 5 is a schematic representation of the implementation of discrete capacitors series-mounted on insulating plates, according to the invention.

FIG. 5 shows an embodiment of series-mounted discrete capacitors according to the invention. In the example of FIG. 5, the capacitors are implemented on rectangular insulating plates 20. In one example, as illustrated in FIG. 5, the compact component 11 has three insulating plates 20a, 20b and 20c. Each of the plates 20a, 20b and 20c here has a length of ten centimeters and a width of three centimeters. The plates 20a, 20b and 20c may have a thickness ranging from some mm to three mm. In a preferred embodiment, the insulating plates 20a, 20b and 20c are made out of a ceramic material.

The compact component 11 may have as many plates as necessary, according to the different embodiments of the invention.

The compact component 11 thus has a first plate 20a representing the upper plate of said device. The upper plate 20a is the plate situated just beneath the plate comprising the measurement resistor R1. The measurement device also has a second plate 20b representing the intermediate plate of said device. Finally, it has a third plate 20c representing the lower plate of said device.

The plates 20a, 20b and 20c are placed so as to be facing each other relative to the others. In other words, the plates 20a, 20b and 20c are stacked so as to save space in the measuring device. Each plate 20a, 20b and 20c respectively has an upper face 21a, 21b and 21c and a lower face 22a, 22b and 22c. These upper faces 21a, 21b and 21cs are respectively the faces of the plates 20a, 20b and 20cs facing the lower face of the plate comprising the measurement resistor R1. The lower faces of the plates are the input faces of the plates in the measurement device.

The upper faces 21a, 21b and 21c of the plates 20a, 20b and 20c are the faces on which the capacitors are preferably made. In one variant, the capacitor may be made only on the lower faces or on both the lower and upper faces of the plates, so long as the imperatives of insulation are complied with.

In the example of FIG. 5, the upper faces 21a, 21b and 21c of the plates 20a, 20b and 20c have a succession of metallized strips 23 and insulating strips 24. In the example of FIG. 5, the metallized strips 23 are shown in black and the insulating strips 24 are shown as blanks. The number of plates 20a, 20b and 20c to be stacked in the measuring device depends especially on the capacitance of the capacitors.

The metallized strips 23 may be made with silk-screen printing ink. They may also be made by a bonding of metal film on the plate. In one example, the metallized strips are made with a copper or aluminium or tin material.

In the invention, the width 25 of the metallized strips 23 is greater than or equal to the width 26 of the insulating bands 24. The minimum width 25 needed for the implementation of the invention is determined as a function of an electrical insulation parameter. This insulation parameter depends inter alia on the thickness of the metallized strips 23, the number of strips and the thickness of the films.

In order to obtain discrete and series-mounted capacitors, the metallized strips 23 of one face of a bottom plate overlap two successive metallized strips of one face of the plate that is directly above it. In the example of FIG. 5, the width 25 of each metallized strip 23 of the intermediate plate 20b crosses two consecutive metallized strips 25 of the upper plate 20a. Similarly, the width 25 of each metallized strip 23 of the lower plate 20c crosses two consecutive metallized strips 25 of the lower plate 20c, and so on and so forth for the other plates situated beneath the lower plate 20c.

In general, between two successive plates, the metallizations of the bottom plate encroach on two consecutive metallizations of the top plate. The top plate is the plate closest to the measurement resistor.

The plates 20a, 20b and 20c have connections (not shown) placed on the sides 27 and 28 of said plates.

This type of embodiment of the capacitors gives a high-voltage capacitor that is spatially capable of having a potential that increases in steps. Similarly, the value of the capacitances is totally controlled. Thus, in the invention, the capacitive couplings are geometrically linked.

Figure 6:
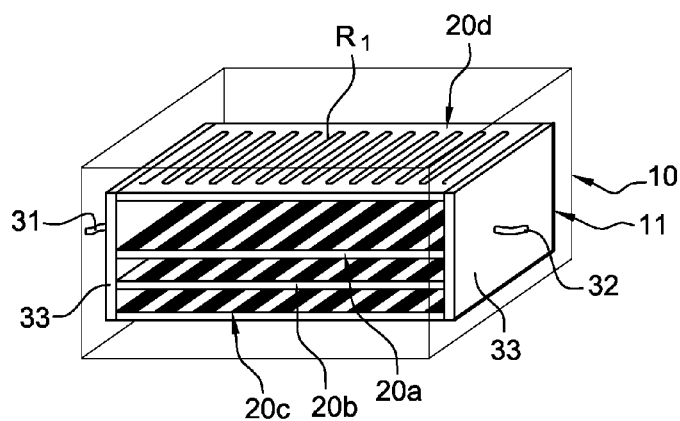
FIG. 6 shows an electronic component comprising both the measurement resistor and the capacitors according to the invention.

FIG. 6 shows the measurement device 10 seen from the top. The device 10 has a compact component 11. This compact component 11 is formed by the integration of the measurement resistor R1 with the protection capacitors. The measurement resistor R1 is made on a plate 20d situated above the upper plate 20a. The plate 20d preferably has the same characteristics as the other plates 20a, 20b and 20c.

Thus, the measurement resistor R1 is made on the ceramic plate 20d by means of a resistive coil. This resistive coil may be made by means of silk-screen printing ink. The measurement resistor R1 may be made out of resistive and discrete components. It may also be made on a resistive component silk-screen printed on the ceramic plate 20d. In one variant, the measurement resistor R1 is formed by a resistive component obtained by laser on the ceramic plate 20d. It may be made by any other means for obtaining a measurement resistor capable of embodying the invention.

This compact component 11 has two connections 31 and 32 obtained by a soldering 33 of the end of the plates 20a, 20b, 20c and 20d, in this case made of ceramic and superimposed.

The use of ceramic plates makes it possible to preserve a measurement result that is optimum in time. Similarly, ceramic withstands very high temperatures. This type of assembly is geometrically stable while at the same time showing great mechanical robustness.

In one variant, the measurement resistor R1 may be made on the upper plate 20a. In this case, the capacitors of the plate 20a are made on the lower face of said plate. This gives a gain in space in the measurement device.

With an embodiment of the invention, the potential obtained by the measurement resistor R1 and the potential of gain by capacitive effect of the capacitors is the same.

Figure 7:
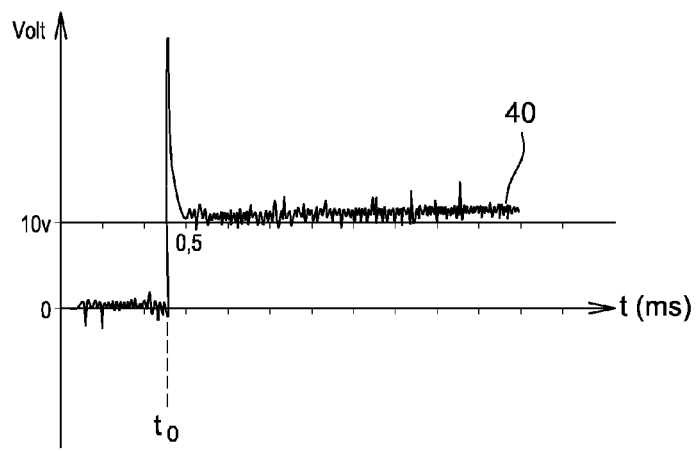
FIG. 7 is a graph showing the pulse response given by the measurement device of the invention.

FIG. 7 is a graph showing a pulse response given by the measurement device of the invention. The curve 40 of the graph of FIG. 7 is represented in Cartesian co-ordinates. The x-axis represents the time in milliseconds and the y-axis represents the voltage given by the measurement device in volts.

At the instant t0, the high-voltage generator delivers voltage of 100 kilovolts. The measurement device connected to the generator automatically detects this high voltage and, in a time span equal to 0.5 milliseconds, it gives an almost perfect pulse response of 10 volts.

Embodiments of the invention may thus appreciably improve the prior-art measurement devices in terms of both response time and precision of results.

This measurement device can easily be integrated into the generator.

As mentioned above, the foregoing detailed description is by way of illustration and not of limitation. It is intended that embodiments of the invention should be limited only by the appended claims, or their equivalents, in which it has been endeavored to claim broadly all inherent novelty.

What is claimed is:

1. A high-voltage generator of an X-ray device, said high-voltage generator comprising:
   a high-voltage measurement device connected to terminals of the high-voltage generator, the high voltage measurement device comprising a compact component comprising a measurement resistor and a plurality of capacitors,
   wherein the measurement resistor has a first end connected to the high-voltage generator and a second end connected to a measurement point at which voltage is measured,
   wherein the compact component comprises at least two insulating plates facing each other,
   wherein the measurement resistor is made on one face of a plate,
   wherein each of the plurality of capacitors is made on faces of plates situated beneath the face of the plate that comprises the measurement resistor, and
   wherein each of the plurality of capacitors comprises a succession of metallized strips and insulating strips and the metallized strips of one face of a bottom plate overlap two metallized strips of one face of a plate that is directly above.

2. A generator according to claim 1, wherein the insulating plates are made of ceramic.

3. A generator according to claim 1, wherein the capacitors are distributed discretely and series-mounted.

4. A generator according to claim 1, wherein a width of the metallized strips is greater than or equal to a width of the insulating strip.

5. A generator according to claim 1, wherein the measurement resistor is made on an upper face of the insulating plate by screen-printing with a resistive ink.

6. A generator according to claim 5, wherein the resistive component of the measurement resistor is screen-printed ink.

7. A generator according to claim 5, wherein the resistive component of the measurement resistor is obtained by laser etching on the upper face of the insulating plate.

8. A generator according to claim 1, wherein the measurement resistor is made out of resistive and discrete components.

9. A generator according to claim 1, wherein the metallized strips are made of a silk-screen-printed metal.

10. A generator according to claim 1, wherein the metallized strips are made by bonding to the insulating plate to a metal film.

11. A generator according to claim 1, wherein the metallized strips are made of copper or aluminum.

12. A generator according to claim 1, wherein the minimum width of the metallization strips is determined as a function of a preliminarily defined electrical insulation parameter.

13. A generator according to claim 1, wherein the number of plates on which the capacitors are made depends on the capacitance of the capacitors.

14. A generator according to claim 1, wherein the capacitors are parallel-connected to the measurement resistor, wherein the measurement device comprises a balancing capacitor (C) connected to the measurement point and to a ground (M).

15. A generator according to claim 14, wherein the balancing capacitor (C) has a capacitance that is less than the capacitance of the capacitors of the plates, in a ratio that is inversely proportional to that of the resistors.

16. A generator according to claim 1, wherein each of the plurality of the capacitors is connected to ground and to the high-voltage generator at a connection point different from that of the measurement resistor.

* * * * *

UNITED STATES PATENT AND TRADEMARK OFFICE
CERTIFICATE OF CORRECTION

PATENT NO.         : 7,898,239 B2                                                              Page 1 of 1
APPLICATION NO.    : 11/943431
DATED              : March 1, 2011
INVENTOR(S)        : Ernest et al.

It is certified that error appears in the above-identified patent and that said Letters Patent is hereby corrected as shown below:

In Column 6, Line 44, delete "21cs" and insert -- 21c --, therefor.

In Column 6, Line 45, delete "20cs" and insert -- 20c --, therefor.

Signed and Sealed this

Thirteenth Day of September, 2011

David J. Kappos
*Director of the United States Patent and Trademark Office*